United States Patent
Sheu

(10) Patent No.: US 7,189,495 B2
(45) Date of Patent: Mar. 13, 2007

(54) METHOD OF FORMING PHOTORESIST PATTERN FREE FROM SIDE-LOBE PHENOMENON

(75) Inventor: Wei-Hwa Sheu, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 135 days.

(21) Appl. No.: 10/447,856

(22) Filed: May 29, 2003

(65) Prior Publication Data

US 2004/0241555 A1    Dec. 2, 2004

(51) Int. Cl.
*G03F 7/20* (2006.01)
*G03F 1/00* (2006.01)

(52) U.S. Cl. .......................... 430/311; 430/5

(58) Field of Classification Search ............... 430/5, 430/311
See application file for complete search history.

(56) References Cited

U.S. PATENT DOCUMENTS

| 5,888,674 A | * | 3/1999 | Yang et al. | 430/5 |
| 6,214,497 B1 | * | 4/2001 | Stanton | 430/5 |
| 6,291,113 B1 | * | 9/2001 | Spence | 430/5 |
| 2003/0064300 A1 | * | 4/2003 | Watanabe | 430/5 |
| 2003/0165750 A1 | * | 9/2003 | Tanaka et al. | 430/5 |

FOREIGN PATENT DOCUMENTS

| JP | 2000-395786 | 12/2000 |
| TW | 374866 | 11/1999 |

* cited by examiner

*Primary Examiner*—S. Rosasco
*Assistant Examiner*—John Ruggles
(74) *Attorney, Agent, or Firm*—Thomas, Kayden, Horstemeyer & Risley

(57) ABSTRACT

A method of forming a photoresist layer free from a side-lobe. A mask consists of a side-lobe region, a pattern region, and an intermediate region, wherein the side-lobe region is the corresponding area of the side-lobe that used to be produced in the photoresist layer, the pattern region is the corresponding area of the pattern formed in the photoresist layer, and the intermediate region is the area between the side-lobe region and the pattern region. The method is characterized in that the transmittance of the side-lobe region is set lower than that of the intermediate region so that the side-lobe region has the light intensity lower than threshold required to trigger the photoreaction of the material for said photoresist layer.

7 Claims, 5 Drawing Sheets

METHOD OF FORMING PHOTORESIST PATTERN FREE FROM SIDE-LOBE PHENOMENON

BACKGROUND OF THE INVENTION

1. Field of the Invention

The present invention relates in general to a method of forming a photoresist pattern free from side-lobe phenomenon, and more particularly to a method of forming a photoresist pattern free from side-lobe phenomenon by improving the design of the mask.

2. Description of the Related Art

Optical lithography has advanced in recent years in its ability to produce very small features. The most important recent development in lithography was the introduction of a photomask structure called a phase shift mask (PSM). Phase shift masks enable compensation for the diffraction effects which otherwise limit the size of the smallest features imaged by optical lithography method.

Optical lithography refers generally to the technology which enables etching patterns on a substrate through use images being developed onto the substrate by a mask. Generally, the process involves directing light (such as ultraviolet light) through a photomask to expose a light-sensitive film previously deposited on the substrate. If the lightsensitive film is a so-called onto the substrate by a mask. Generally, the process involves directing light (such as ultraviolet light) through a photomask to expose a light-sensitive film previously deposited on the substrate. If the lightsensitive film is a so-called positive resist and the resist is located beneath a clear area in the photomask, the resist undergoes a physical and chemical change that renders it soluble in a development solution. This process results in the transfer of an image from the photomask to the resist film. Finally, the application of an acid to the surface of the resist film transfers the image on the resist film to the surface of the substrate.

FIG. 1(a) to FIG. 1(d) illustrate how the mask pattern, the light transmittance, the light intensity, and the developed photoresist related to each other according to a conventional method. A mask 10, as shown in FIG. 1(a), is used to selectively expose portions of a wafer 20 covered with a photoresist layer 26 shown in FIG. 1(d). The mask 10 includes a dark region 12, a partial-clear region 14, and a clear region 16. Light 30 transmits through the mask 10 and exposes the photoresist layer 26 on the wafer 20.

The transmittance of the mask 10 is plotted in FIG. 1(b), wherein the transmittances of the dark region 12, the partial-clear region 14, and the clear region 16 are 0%, 6%, and 100%, respectively.

FIG. 1(c) illustrates the intensity of the light exposed onto the photoresist layer 26. The light exposure profile has a main peak 42 corresponding to the center of the clear region 16. Away from the main which is indicated by the horizontal dashed line.

FIG. 1(d) illustrates the developed photoresist layer 26 after exposure by using the mask 10 of FIG. 1(a). The undesired side-lobe hole 28 is formed in the photoresist layer 26, along with the predetermined hole 24. The predetermined hole 24, which corresponds to the clear region 16 on the mask 10, is used to create a contact hole in the layer under the photoresist layer 26. The undesired side-lobe hole 28 causes a side-lobe phenomenon in the layer under the photoresist layer 26, which usually impedes the process window.

It is necessary to propose a method or design on the mask to suppress the side-lobe phenomenon.

SUMMARY OF THE INVENTION

It is therefore an object of the invention to provide a method of solving the side-lobe phenomenon.

The present invention provides a method to form a photoresist layer free from side-lobe. The photoresist layer is exposed with a mask. The mask consists of a side-lobe region, a pattern region, and an intermediate region, wherein the side-lobe region is the corresponding area of the side-lobe possibly produced in the photoresist layer, the pattern region is the corresponding area of the pattern formed in the photoresist layer, and the intermediate region is the area between the side-lobe region and the pattern region. The present invention suppresses the side-lobe phenomenon by setting the transmittance of the side-lobe region lower than the transmittance of the intermediate region.

The side-lobe region, the pattern region, and the intermediate region are formed by etching a mask blank, The mask blank can be a mask blank of any semi-transparent or halftone material. The transmittance of the mask blank, the side-lobe region, the pattern region, and the intermediate region are 0%, 0 to 4%, 100%, and 4 to 100%, respectively. The photoresist layer can be composed of I-line photoresist material or deep-UV photoresist material.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 2A:
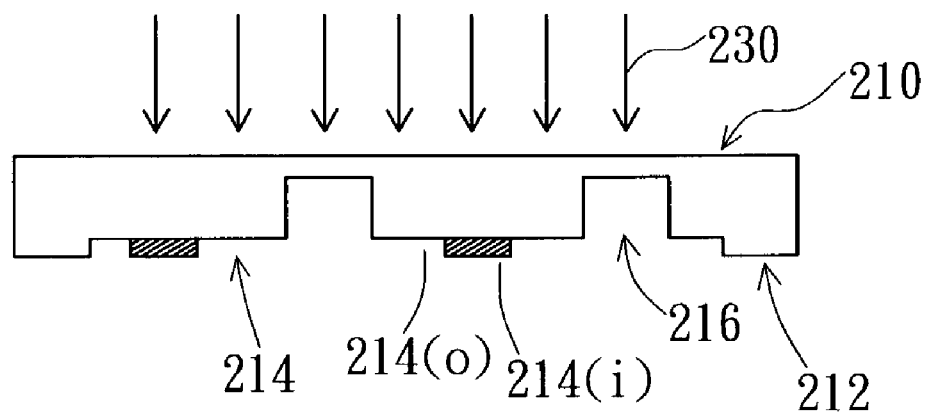
FIG. 2(a) to FIG. 2(d) illustrate the correspondence between the mask, the light transmittance, the light intensity, and the developed photoresist according to the method of the present invention.

The present invention provides a method to solve the side-lobe phenomenon, such that the process window of the photolithography manufacturing can be improved. FIG. 2(a) to FIG. 2(d) illustrate the relation between the mask, the light transmittance, the light intensity, and the developed photoresist according to the method of the present invention. FIG. 2(a) shows the cross-sectional view of a mask 210, which is proposed to form a plurality of contact holes disposed in a square-matrix arrangement.

Figure 2B:
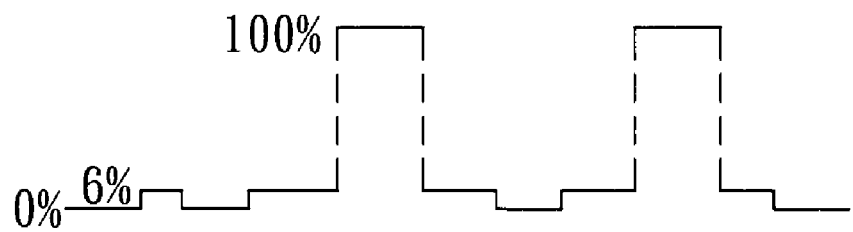
Figure 2C:
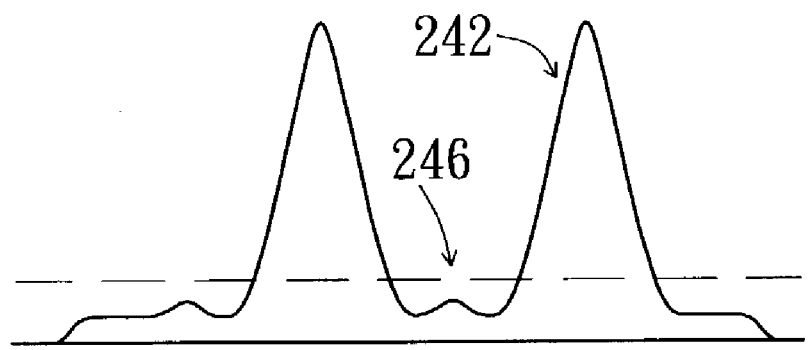
Figure 2D:
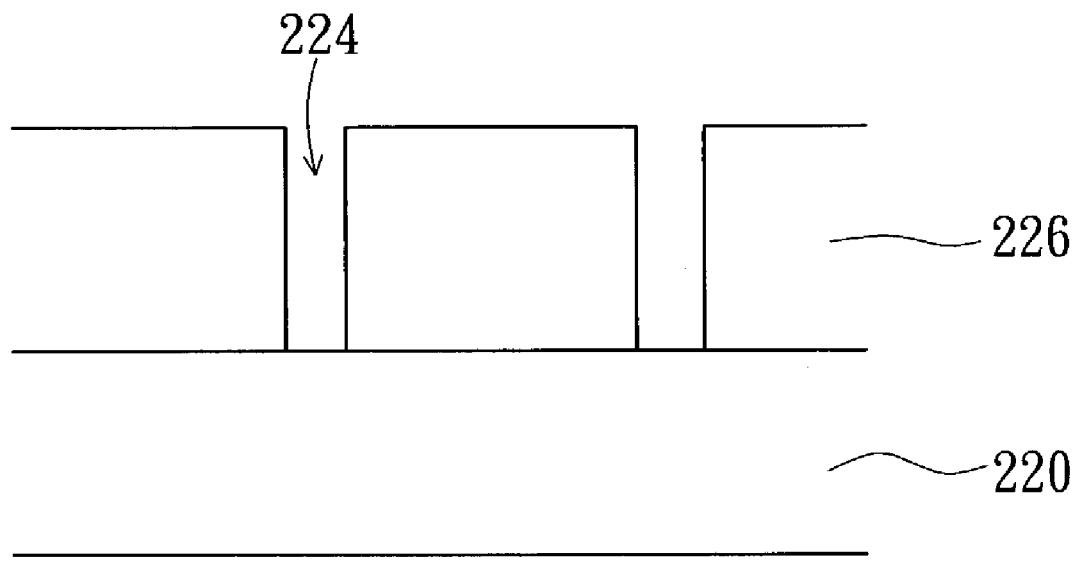

Referring to FIG. 2(d), a photoresist layer 226 is coated on a wafer 220. The photoresist layer 226 was developed according to the pattern on the mask 210 of FIG. 2(a). The mask 210 is used to selectively expose portions of a wafer 220, which is covered with the photoresist layer 226. The mask 210 includes a dark region 212, a partial-clear region 214, and a clear region 216, wherein the dark region 212 is located at the periphery of the mask 210. Light 230 transmits through the mask 210 and exposes the photoresist layer 226 on the wafer 220.

The mask 210 was originally an all dark region. The partial-clear region 214 and the clear region 216 of the mask 210 are formed by etching, leaving the dark regions 212, as shown in FIG. 2(a). The etching process is particularly designed so that the transmittance of the dark region 212, the partial-clear region 214, and the clear region 216 are 0%, 0 to 20%, and 100%, respectively. Herein, the etching is taken as an example of forming the mask 210 with three predetermined regions. However, this invention is not limited thereto, other methods able to form the desired mask 210 of the invention are within the scope of the invention.

Figure 1A:
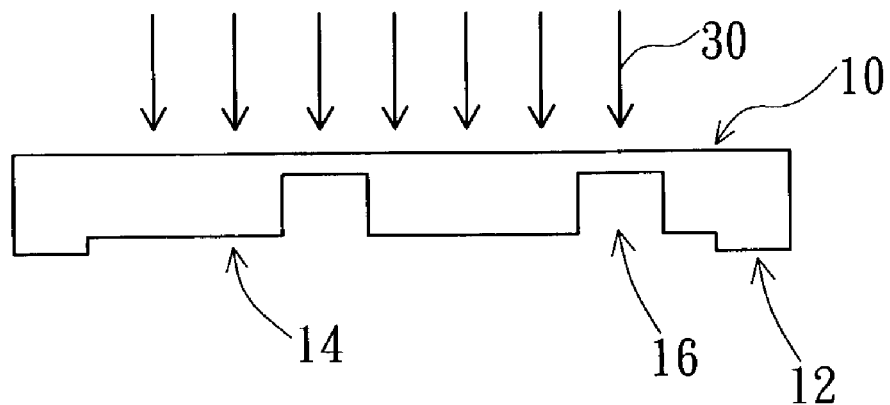
FIG. 1(a) to FIG. 1(d) illustrate the correspondence between the mask, the light transmittance, the light intensity, and the developed photoresist according to a conventional method.
Figure 1B:
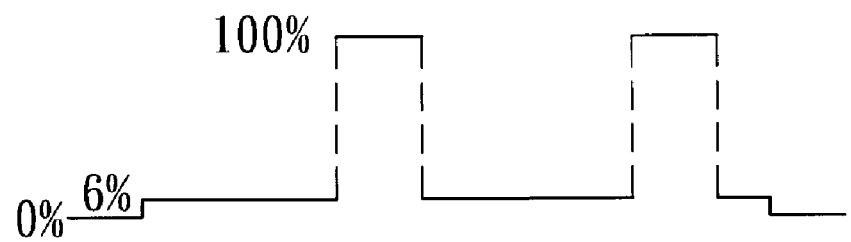
Figure 1C:
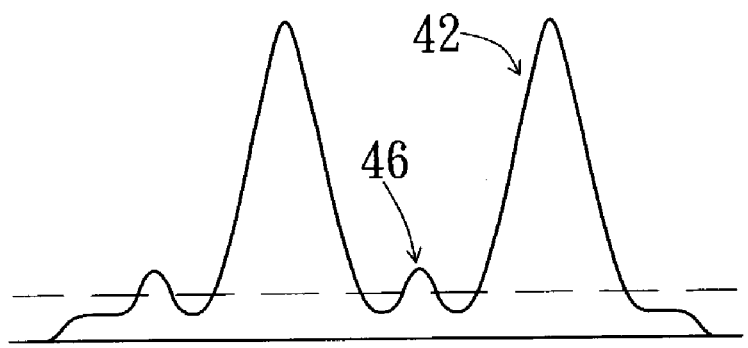
Figure 1D:
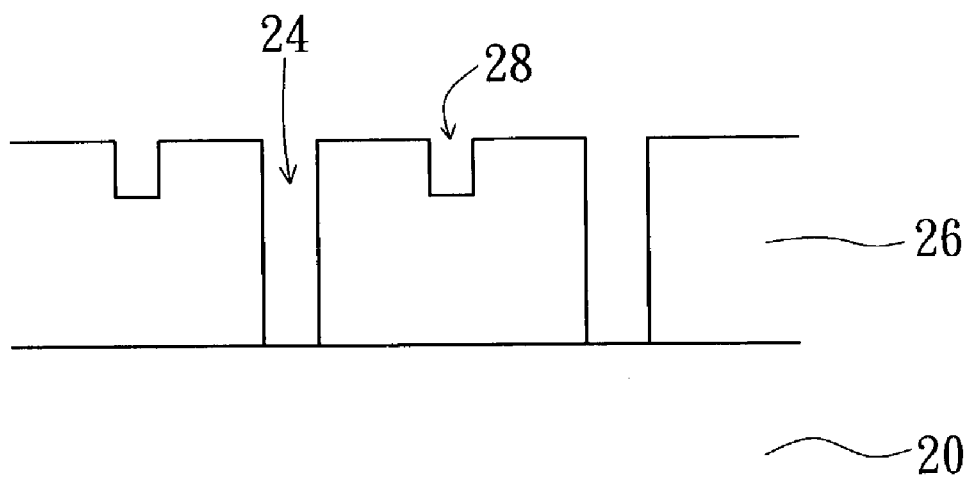

The partial-clear region 214 further includes an outer region 214(o) and an inner region 214(i). The outer region 214(o) has a transmittance in a range from 4 to 20%, and the transmittance of the inner region 214(i) ranges from 0 to 4%. The inner region 214(i) corresponds to the site where side-lobe hole 28 (shown in FIG. 1(d)) is formed. The side-lobe hole 28 is formed owing to the diffraction effect, which is evidenced by the minor peak 46 of the intensity curve in FIG. 1(c). According to the invention, the transmittance at the corresponding position of the side-lobe hole 28 is reduced by forming an inner region 214(i) in order to impair the minor peak 46. In this embodiment, the preferred transmittance of the outer region 214(o) is about 6% transmittance, and the preferred transmittance of the inner region 214(i) is about 0%.

The transmittance of the whole mask 210 is plotted in FIG. 2(b), wherein the transmittances of the dark region 212, and the clear region 216 are about 0% and 100%, respectively. The transmittance of the inner region 214(i) of the partial-clear region 214 can be about 0% and the transmittance of the outer region 214(o) of the partial-clear region 214 can be about 6%.

FIG. 2(c) illustrates the intensity of the light exposed onto the photoresist layer 226. The light exposure profile has main peaks 242, which correspond to the clear region 216. Away from the main peaks 242, there are minor peaks 246 corresponding to the center of the partial-clear region 214. According to the preferred embodiment of the present invention, the minor peaks 246 are much lower than the threshold required to trigger the photo-reaction of material for the photoresist layer 226, which is indicated by the horizontal dashed line.

FIG. 2(d) illustrates the developed photoresist layer 226 after exposure by using the mask 210 of FIG. 2(a). The photoresist layer 226 can be composed of I-Line photoresist material or the deep-UV photoresist material. In the photoresist layer 226, the holes 224 for defining a contact hole are formed in a condition without side-lobe phenomenon. It is clearly shown in FIG. 2(c) that the undersired minor peak 246 is much lower than the triggering threshold and no undesired concave is formed on the photoresist layer 226. We can therefore conclude that, according to the present invention, the side-lobe phenomenon is successfully impeded.

Figure 3A:
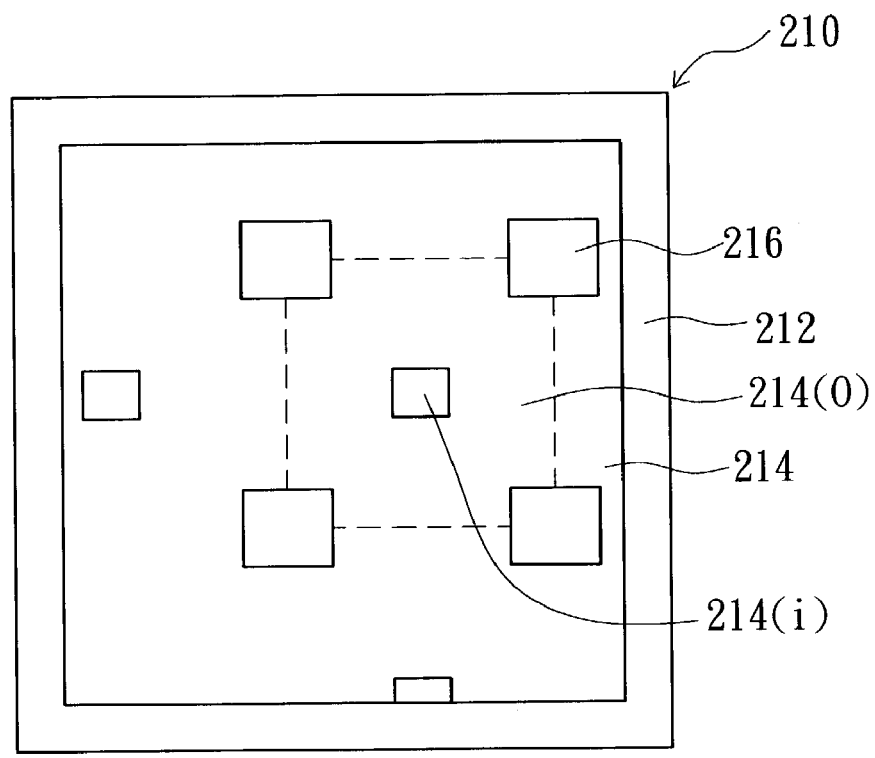
FIG. 3(a) and FIG. 3(b) are respectively the top view of FIGS. 2(a) and 2(d).
Figure 3B:
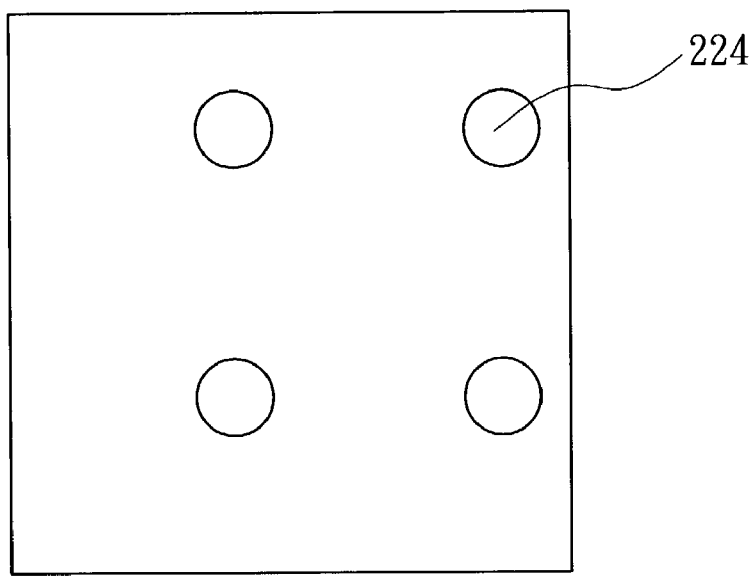

FIG. 3(a) and FIG. 3(b) are the top view of the mask 210 and the photoresist layer 226, which correspond to FIG. 2(a) and 2(d), respectively.

In FIG. 3(a), the mask 210 has a base including a partial-clear region 214 and a dark region 212 located around the partial-clear. The partial-clear region 214, represented inside the dashed lines, includes an inner region 214(i) and an outer region 214(o) of rectangular shape. The inner region 214(i) is positioned in the center of the partial-clear region 214 and the outer 214(o) is the part of the partial-clear region 214 other than the inner region 214(i). The mask 210 further includes a plurality of clear regions 216 located at the corners of the rectangular shape.

In FIG. 3(b) the hole 224, corresponding to the clear region 216, is also disposed in square-matrix, and the side-lobe phenomenon has been suppressed by the 0% transmittance of the inner region 214(i).

In FIG. 3(b) the hole 224, corresponding to the clear region 216, is also disposed in square-matrix, and the side-lobe phenomenon has been suppressed by the 0% transmittance of the inner region 214(i).

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a photoresist layer free from a side-lobe by exposing a mask, comprising:
    providing a mask blank that is originally all dark having a transmittance of 0% and etching said mask blank to form a partial-clear region and a dark region located around said partial-clear region;
    etching said mask blank within said partial-clear region to form a patterned clear region, an intermediate partial-clear region and a side-lobe region, and leaving the dark region without etching, wherein said patterned clear region is located at corners of a rectangle defined within said partial-clear region, said side-lobe region is at a center of said rectangle, and said side-lobe region and said patterned clear region are spaced by said intermediate partial-clear region; and
    setting the transmittance of said side-lobe region lower than the transmittance of said intermediate partial-clear region so that the side-lobe region has a light intensity lower than the threshold required to trigger a photoreaction of a material for said photoresist layer.

2. The method according to claim 1, wherein the transmittance of said intermediate partial-clear region is 4% to 20%.

3. The method according to claim 2, wherein the transmittance of said side-lobe region is 0% to 4%.

4. The method according to claim 1, wherein the transmittance of said pattern clear region is 100%.

5. The method according to claim 1, wherein said photoresist layer is composed of I-Line photoresist material.

6. The method according to claim 1, wherein said photoresist layer is composed of deep-UV photoresist material.

7. The method according to claim 1, wherein said side-lobe region is rectangular-shaped.

* * * * *